United States Patent
Lee et al.

(10) Patent No.: US 12,408,448 B2
(45) Date of Patent: Sep. 2, 2025

(54) DEEP TRENCH ISOLATION STRUCTURE AND METHODS FOR FABRICATION THEREOF

(71) Applicant: TAIWAN SEMICONDUCTOR MANUFACTURING COMPANY, LTD., Hsinchu (TW)

(72) Inventors: Bi-Shen Lee, Hsinchu (TW); Chia-Wei Hu, Kaohsiung (TW); Hai-Dang Trinh, Hsinchu (TW); Min-Ying Tsai, Kaohsiung (TW); Ching I Li, Tainan (TW); Hsun-Chung Kuang, Hsinchu (TW); Cheng-Yuan Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 447 days.

(21) Appl. No.: 17/838,994

(22) Filed: Jun. 13, 2022

(65) Prior Publication Data

US 2023/0402487 A1   Dec. 14, 2023

(51) Int. Cl.
*H10F 39/00* (2025.01)
*H10F 39/12* (2025.01)
*H10F 39/18* (2025.01)

(52) U.S. Cl.
CPC ......... *H10F 39/028* (2025.01); *H10F 39/024* (2025.01); *H10F 39/182* (2025.01); *H10F 39/199* (2025.01); *H10F 39/8053* (2025.01); *H10F 39/8063* (2025.01); *H10F 39/807* (2025.01)

(58) Field of Classification Search
CPC .......... H01L 21/0234; H01L 21/02323; H01L 21/76–76237; H01L 27/1463; H10F 39/807
See application file for complete search history.

(56) References Cited

U.S. PATENT DOCUMENTS

| | | | | |
|---|---|---|---|---|
| 6,878,644 B2 * | 4/2005 | Cui | ................... | H01L 21/76229 438/782 |
| 10,811,453 B1 * | 10/2020 | Mun | ................... | H01L 27/1464 |
| 10,879,111 B1 * | 12/2020 | Yen | ................... | H01L 21/02247 |
| 11,664,403 B2 * | 5/2023 | Huang | .............. | H01L 27/14623 257/435 |
| 2002/0153478 A1 * | 10/2002 | Hsin | ................... | H01L 27/1463 250/227.14 |

(Continued)

*Primary Examiner* — Evren Seven
(74) *Attorney, Agent, or Firm* — NZ Carr Law Office

(57) ABSTRACT

A Deep Trench Isolation (DTI) structure is disclosed. The DTI structures according to embodiments of the present disclosure include a composite passivation layer. In some embodiments, the composite passivation layer includes a hole accumulation layer and a defect repairing layer. The defect repairing layer is disposed between the hole accumulation layer and a semiconductor substrate in which the DTI structure is formed. The defect repairing layer reduces lattice defects in the interface, thus, reducing the density of interface trap (DIT) at the interface. Reduced density of interface trap facilitates strong hole accumulation, thus increasing the flat band voltage. In some embodiments, the hole accumulation layer according to the present disclosure is enhanced by an oxidization treatment.

20 Claims, 17 Drawing Sheets

(56) References Cited

U.S. PATENT DOCUMENTS

| | | | |
|---|---|---|---|
| 2004/0224496 A1* | 11/2004 | Cui | H01L 21/76229 |
| | | | 438/626 |
| 2010/0051940 A1* | 3/2010 | Yamazaki | H01L 21/0234 |
| | | | 257/E29.296 |
| 2010/0059842 A1* | 3/2010 | Choi | H01L 27/1462 |
| | | | 257/E31.127 |
| 2013/0285130 A1* | 10/2013 | Ting | H01L 27/146 |
| | | | 438/57 |
| 2014/0054662 A1* | 2/2014 | Yanagita | H01L 27/14645 |
| | | | 438/73 |
| 2014/0185182 A1* | 7/2014 | Hsieh | H01L 21/02271 |
| | | | 361/301.4 |
| 2015/0061062 A1* | 3/2015 | Lin | H01L 27/14623 |
| | | | 438/69 |
| 2015/0221692 A1* | 8/2015 | Enomoto | H01L 27/14612 |
| | | | 438/73 |
| 2016/0118438 A1* | 4/2016 | Leung | H01L 27/14605 |
| | | | 257/229 |
| 2017/0062496 A1* | 3/2017 | Lai | H01L 27/1464 |
| 2017/0271383 A1* | 9/2017 | Lai | H01L 27/14654 |
| 2020/0066767 A1* | 2/2020 | Leung | H01L 21/765 |
| 2021/0193702 A1* | 6/2021 | Zang | H01L 27/1463 |
| 2021/0249454 A1* | 8/2021 | Suzuki | H01L 27/1463 |
| 2022/0085084 A1* | 3/2022 | Bianchi | H01L 27/14605 |
| 2023/0187203 A1* | 6/2023 | Ino | C23C 16/303 |
| | | | 257/767 |

* cited by examiner

DEEP TRENCH ISOLATION STRUCTURE AND METHODS FOR FABRICATION THEREOF

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are performed.

Various common defects in image sensors, such as optical crosstalk, electrical crosstalk, dark current, and white pixels, become more serious as the image pixel sizes and the spacing between neighboring image pixels continues to shrink. Optical crosstalk refers to photon interference from neighboring pixels that degrades the light-sensing reliability and accuracy of the pixels. Dark current may be referred to the existence of pixel current when no actual illumination is present. In other words, the dark current is the current that flows through the photodiode when no photons are entering the photodiode. White pixels occur where an excessive amount of current leakage causes an abnormally high signal from the pixels, Deep trench isolation (DTI) structures are used to provide electrical and/or optical isolations between high voltage devices and image sensors. As the device dimension decreases, it is challenging to prevent leakage through current DTI structure design. For example, white pixel reduction becomes increasingly challenging for image sensors.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

DETAILED DESCRIPTION

Figure 1:
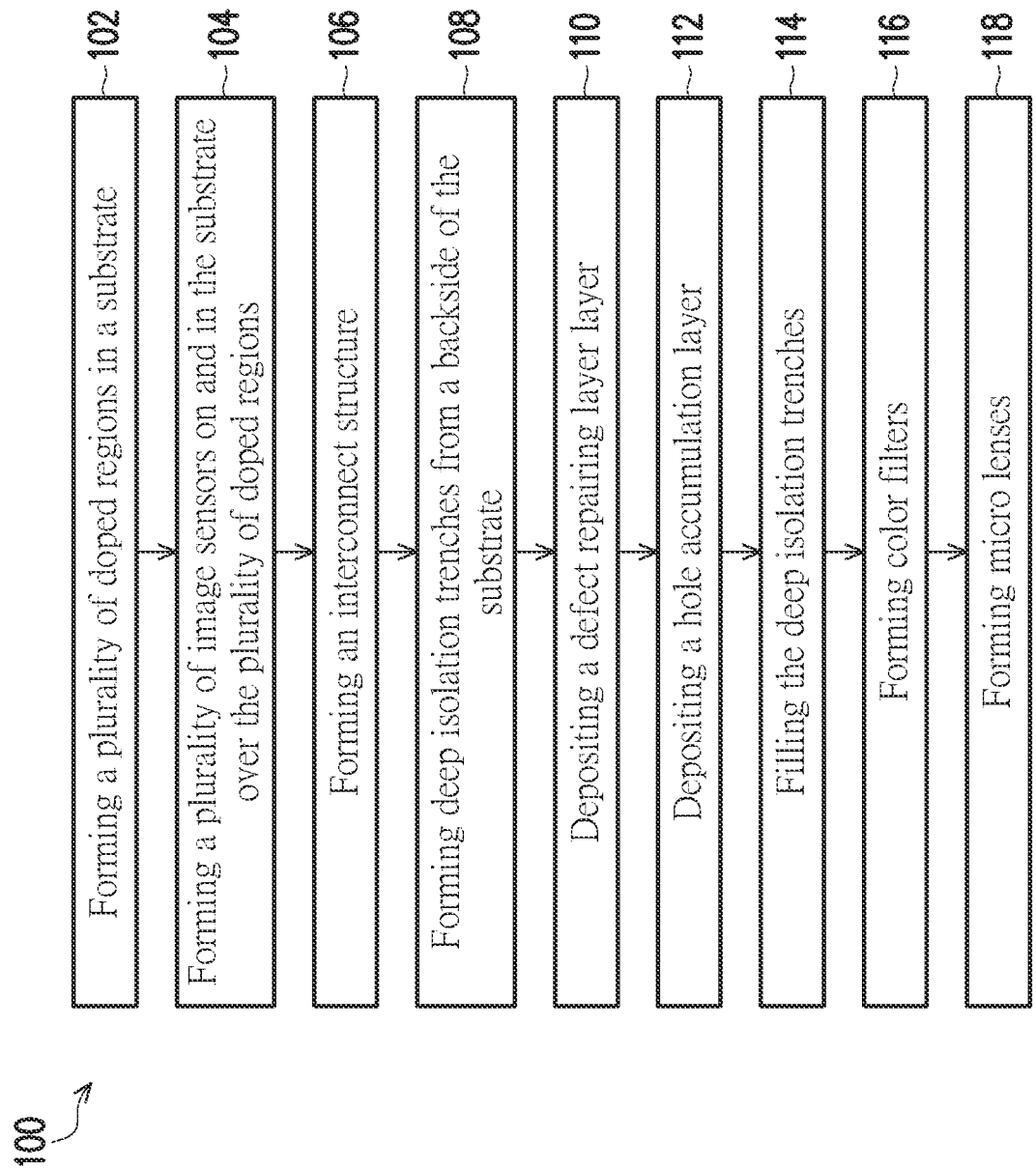
FIG. 1 is a flow chart of a method for fabricating a semiconductor device including DTI structures according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Deep Trench Isolation (DTI) structure in a semiconductor substrate and the method of forming the same are provided according to various embodiments. The intermediate stages of forming the DTI structure are illustrated according to some embodiments. Some variations of some embodiments are discussed.

DTI structures according to embodiments of the present disclosure include a composite passivation layer. In some embodiments, the composite passivation layer includes a hole accumulation layer and a defect repairing layer. The defect repairing layer is disposed between the hole accumulation layer and a semiconductor substrate in which the DTI structure is formed. The defect repairing layer may be a nitrogen or hydrogen rich material. The defect repairing layer reduces lattice defects at the interface between the semiconductor substrate and the DTI structure, thus, reducing the density of interface trap (Dit) at the interface. Reduced density of interface trap facilitates strong hole accumulation at the interface, thus increasing the flat band voltage. In some embodiments, the hole accumulation layer according to the present disclosure is enhanced by an oxidization treatment.

The DTI structure may be used for Backside Illumination (BSI) Complementary Metal-Oxide-Semiconductor (CMOS) image sensors or Front Side Illumination (FSI) CMOS image sensors, logic devices, and any suitable devices in which deep trench isolation are used. In an image sensing device, the defect repairing layer reduces lattice damages at the interface between the DTI structure and the semiconductor substrate, thus, reducing white pixel occurrence without using high temperature anneal.

In image sensing devices, DTI structures may be formed on a front side of the semiconductor substrate with the transistors of the pixel elements or on the backside of the semiconductor substrate. Backside DTI structures that are fabricated after metallization process. To avoid damaging the prior formed metal features, backside DTI structures cannot be annealed at high temperature. The DTI design according to the present disclosure may not require an annealing process at a temperature higher than about 410° C., therefore is particularly beneficial to backside DTI structures.

FIG. 1 is a flow chart of a method 100 for fabricating a semiconductor device including DTI structures according to embodiments of the present disclosure. FIGS. 2, 2A, 3, 3A, 4-7, 7A, 8-9, 9A, 10, and 10A schematically illustrate a semiconductor device 200 at various stages of fabrication according to the method 100. In some embodiments, the semiconductor device 200 fabricated according to the method 100 includes BSI image sensing devices. It is understood that additional steps can be provided before, during, and/or after the method 100, and some of the steps described can be replaced, eliminated, and/or moved around for additional embodiments of the method 100.

Figure 2:
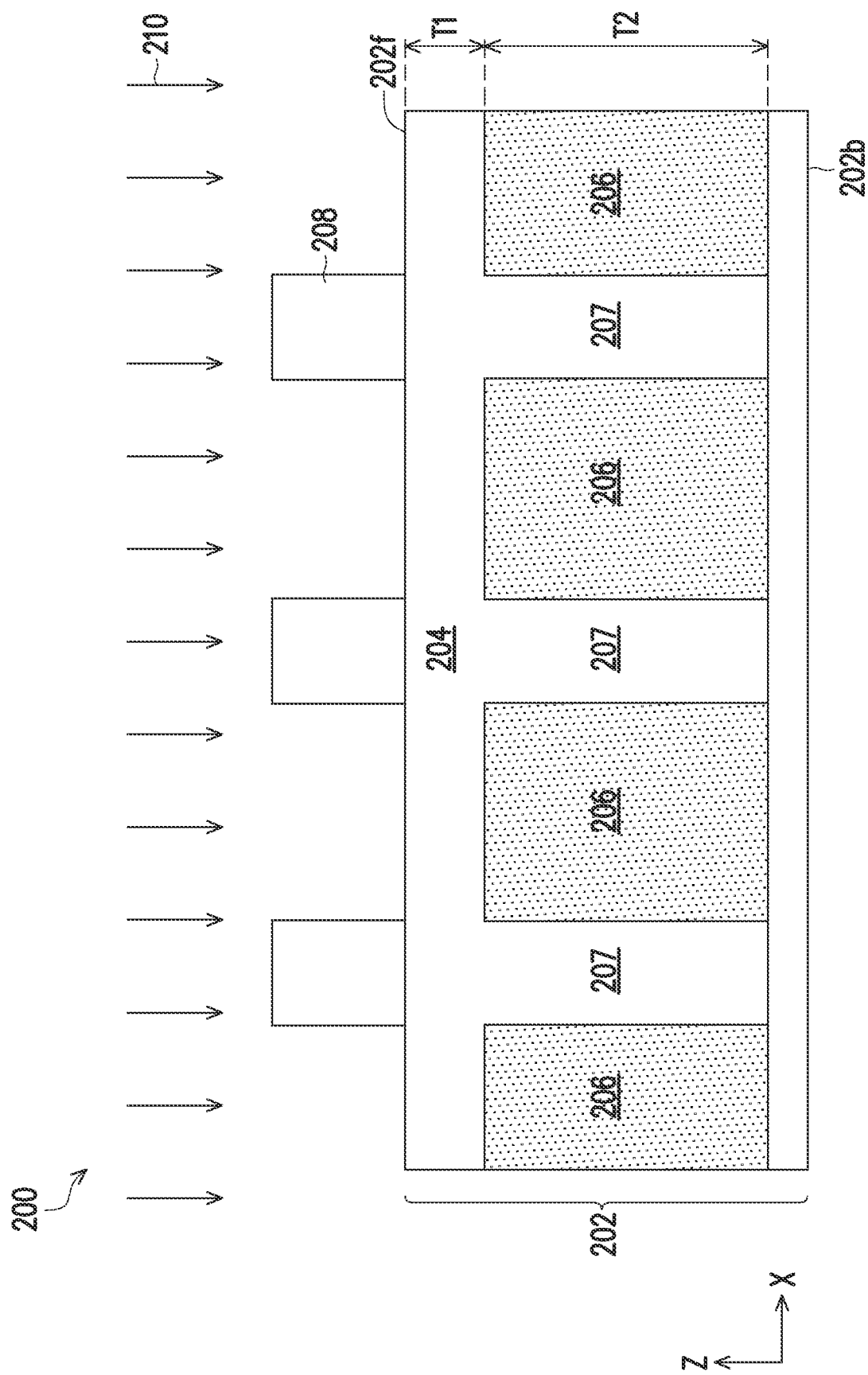
FIGS. 2, 2A, 3, 3A, 4-7, 7A, 8-9, 9A, 10, and 10A schematically illustrate a semiconductor device at various stages of fabrication according to the method of FIG. 1.
Figure 2A:
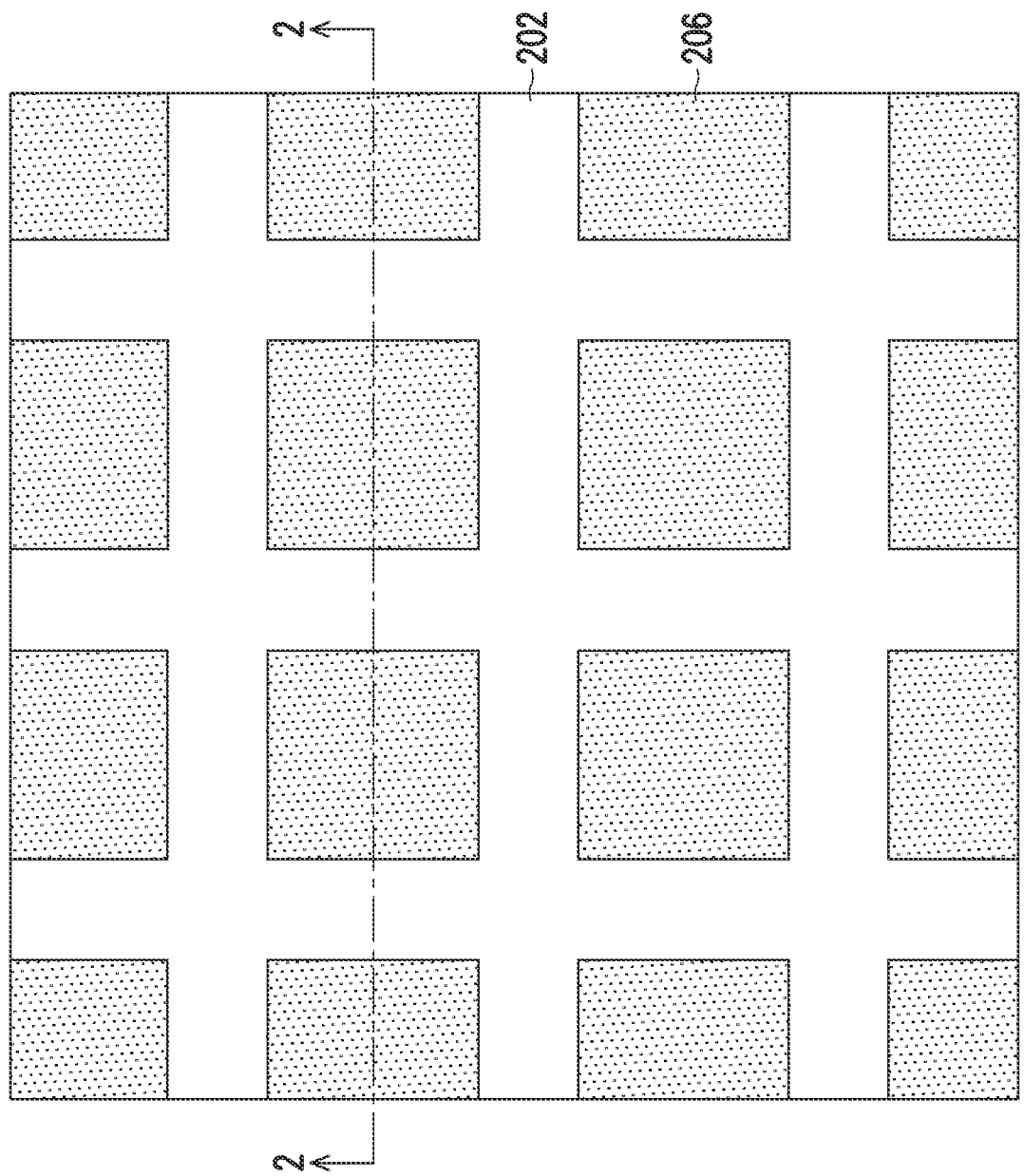

At operation 102 of the method 100, an implantation process is performed to form a plurality of doped regions 206 in a semiconductor substrate 202, as shown in FIGS. 2 and 2A. FIG. 2 is a schematic cross-sectional view of the semiconductor device 200. FIG. 2A is a schematic top view of the semiconductor device 200.

According to some embodiments of the present disclosure, the semiconductor substrate 202 may be a crystalline silicon substrate. According to other embodiments of the present disclosure, the semiconductor substrate 202 includes an elementary semiconductor such as germanium; a compound semiconductor including silicon carbon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates such as multi-layered or gradient substrates may also be used. The semiconductor substrate 202 has a front surface 202f and a back surface 202b. In some embodiments, the front surface 202f and the back surface 202b may be on (100) or (001) surface planes.

The plurality of doped regions 206 may be formed by a selective implantation process. A masking layer 208 may be deposited on the front surface 202f of the semiconductor substrate 202. A patterning process, such as a photolithography process, is performed form a plurality of openings through the masking layer 208 and expose portions of the front surface 202f of the semiconductor substrate 202. In some embodiments, the masking layer 208 may comprise photoresist or a nitride, for example silicon nitride (SiN), patterned using a photolithography process.

The plurality of doped regions 206 are formed by an implantation process to drive implant dopants 210 into the semiconductor substrate 202 from the front surface 202f. As shown in FIG. 2, the plurality of doped regions 206 are located within the semiconductor substrate 202 at a distance T1 from the front surface 202f. The portion of the semiconductor substrate 202 above the plurality of doped regions 206 may be referred as a transistor region 204 because various transistors may be formed in and on the transistor region 204. The plurality of doped regions 206 may have a thickness T2. The distance T1 and thickness T2 may be selected according to circuit design and achieved by adjusting bias applied to the semiconductor substrate 202 and flow density of the dopants 210 during implantation process.

In some embodiments, the plurality of doped regions 206 are intended as light sensing regions for a plurality of pixels in an image sensing device. In some embodiments, the plurality of doped regions 206 may be doped by a n-type dopants and intent to be deep N-type pinned photodiodes (DNPPD) in the plurality of image sensors to be formed. The dopants 210 may include one or more n-type dopants, such as phosphorous, arsenic, antimony, or the like. In some embodiments, the plurality of doped regions 206 may include n-type dopants at a concentration in a range between about 1E15 atom/cm$^3$ and about 1E20 atom/cm$^3$.

As shown in FIG. 2A, the plurality of doped regions 206 are individual areas separated from one another. In some embodiments, each of the doped regions 206 may be form an array with gap regions 207 between neighboring doped regions. As discussed below, DTI structures may be formed in the gap regions 207 to electrically and/or optically isolate the dope regions 206.

DTI structures may include front side DTI structures and backside DTI structures. Front side DIT structures are formed from the front surface 202f during the front end of line (FEOL) processes. A plurality of trenches may be formed in the gap regions 207 of the semiconductor substrate 202 followed by deposition of an isolation layer or a passivation layer, such as one or more high-k dielectric films, on the exposed surfaces of the semiconductor substrate 202. A high temperature annealing process may be performed to reduce density of defect traps at the interface between the semiconductor substrate 202 and the isolation layer or passivation layer. However, front side DTI structures have layout restrictions because front side DTI structures have to avoid areas for pixel transistors formed in and on the front surface 202f of the semiconductor substrate 202. Backside DTI structures are formed from the back surface 206b of the semiconductor substrate 202 usually after FEOL processes and middle end of line (MEOL) processes are completed. Backside DTI structures are not constrained by the layout of pixel transistors formed in the transistor region 204. However, defect traps in the interface between the semiconductor substrate 202 and the backside DTI structures can't be reduced by high temperature anneal to avoid damages to metallic features formed during FEOL and BEOL processes. The DTI structures according to the present disclosure may not need a high temperature anneal, therefore, may be formed from the backside to be both effective and design friendly.

Figure 3:
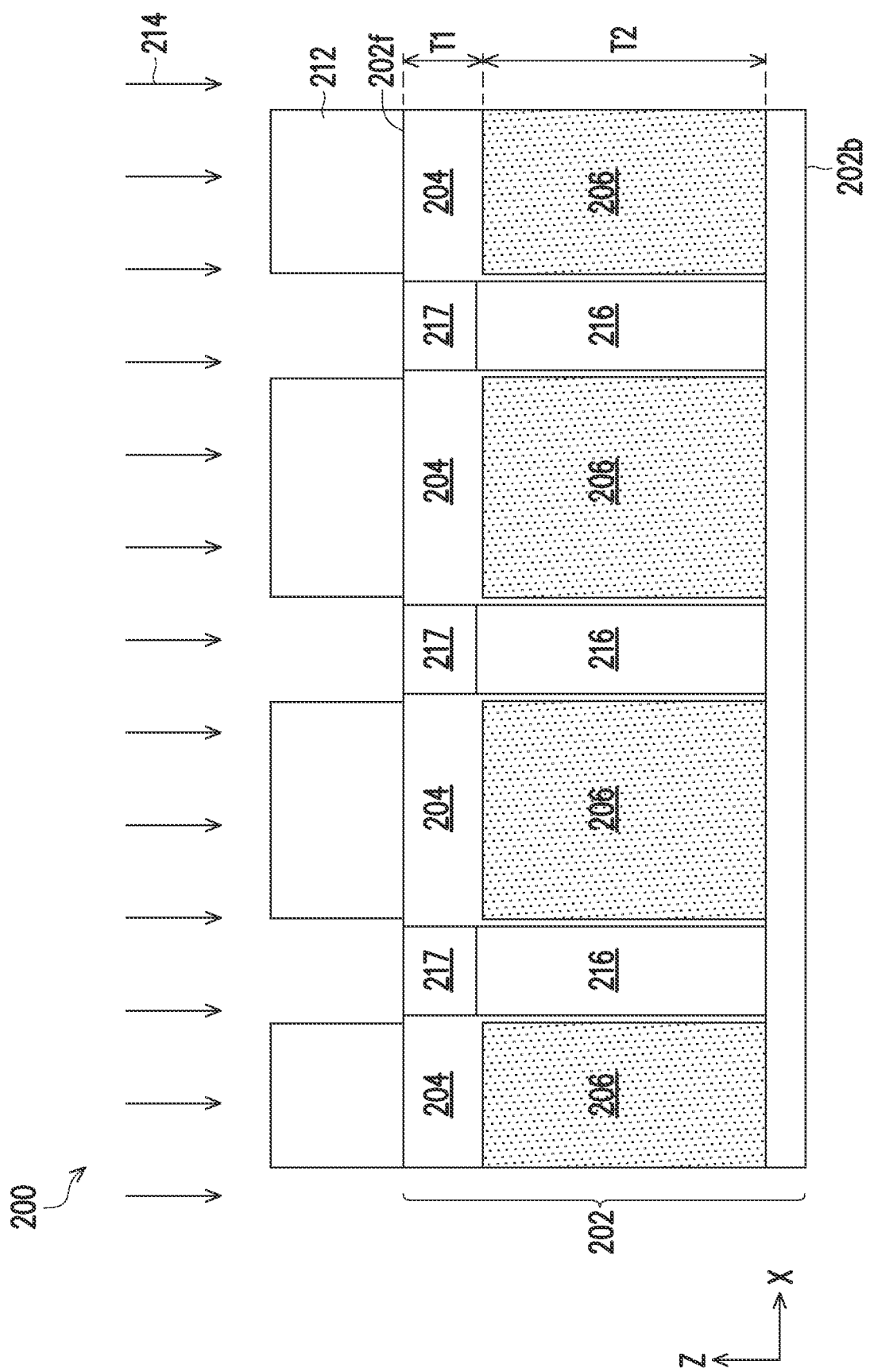
Figure 3A:
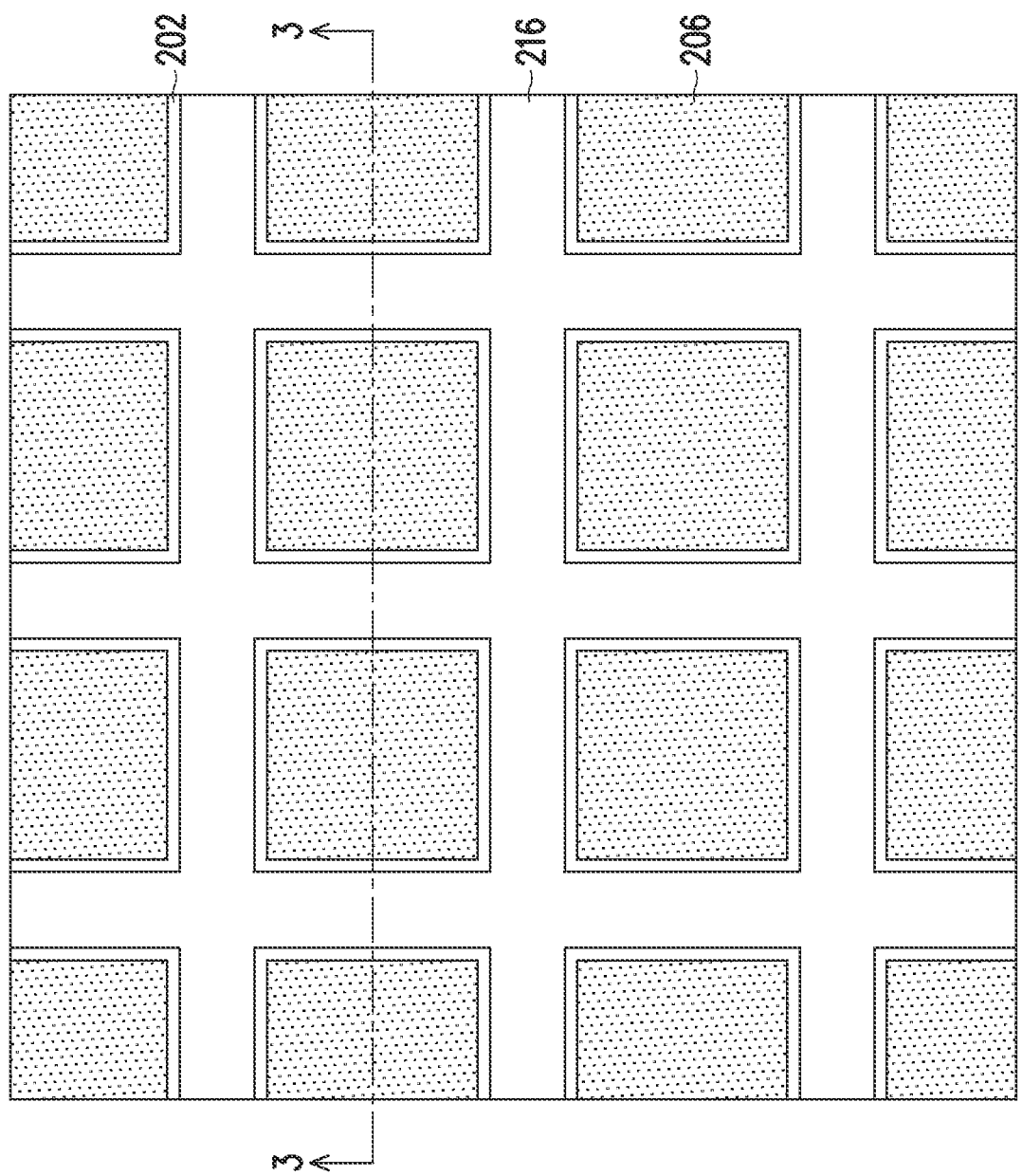

In some embodiments, the semiconductor substrate 202 may be a p-type substrate such that a p-n junction may be formed at the interface between the semiconductor substrate 202 and the DTI structure to be formed. Alternatively, a doping process may be performed to form deep p-wells (DPWs) 216 in the gap regions 207 of the semiconductor substrate 202, as shown in FIGS. 3 and 3A. DIT structures are subsequently formed in the DPWs 216. The DPWs 216 may extend from the front surface 202f to a depth so that the plurality of the doped regions 206 are surrounded by the DPWs 216 along the entire depth T2. In some embodiments, cell p-wells (CPWs) 217 may be formed at an upper portion of the DPWs 216. One or more transistors may be formed on and in the CPWs 217.

The DPWs 216 and the CPWs 217 may be formed by a selective implantation process. A masking layer 212 may be deposited on the front surface 202f of the semiconductor substrate 202. A patterning process, such as a photolithography process, is performed form a plurality of openings through the masking layer 212 and expose portions of the front surface 202f of the semiconductor substrate 202. The DPWs 216 and the CPWs 217 may be formed by one or more implanting processes with one or more p-type dopants 214. The p-type dopants 214 may include boron (B), aluminum (Al), and gallium (Ga). In some embodiments, the DPWs 216 may have a dopant concentration in a range from about 1E10 atom/cm$^3$ to about 1E12 atom/cm$^3$, for example, in a range of from about 2E11 atom/cm$^3$ to about 7E11 atom/cm$^3$. In some embodiments, the CPWs 217 may have a dopant concentration in a range from about 1E11 atom/cm$^3$ to about 1E13 atom/cm$^3$, for example, in a range of from about 1E12 atom/cm$^3$ to about 6E12 atom/cm$^3$. Even though FIG. 3 shows that the DPWs 216 and the CPWs 217 occupy the same areas, it should be noted that, according to design layout, the DPWs 216 and the CPWs 217 may occupy the same areas, different but overlapping areas, or different and not overlapping areas.

Figure 4:
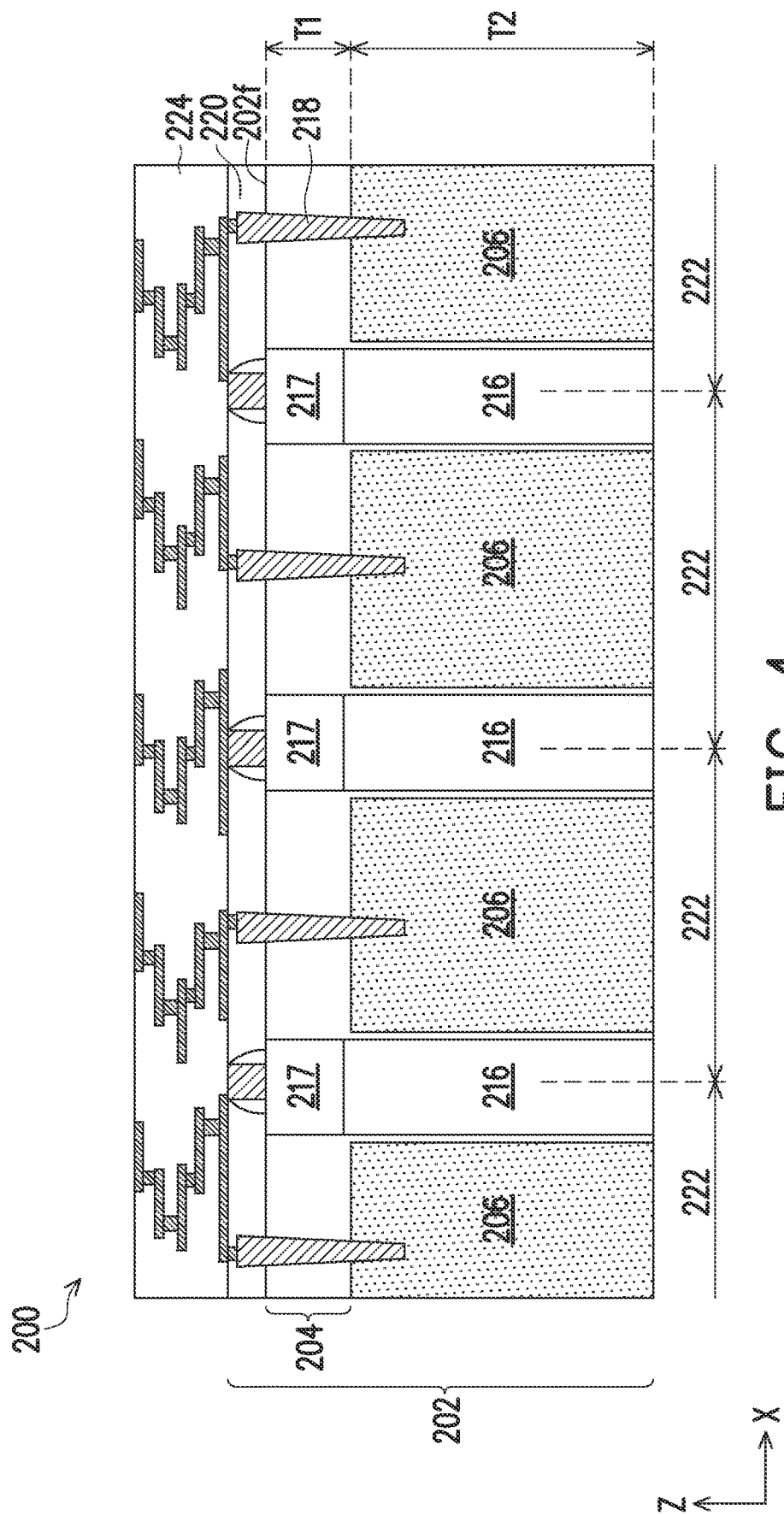

At operation 104, a plurality of device elements 222 are formed in and on the transistor region 204 of the semiconductor substrate 202, as shown in FIG. 4. The plurality of device elements 222 may be any devices, such as an image sensing device, a logic device, an input/output (I/O) device, a memory device. Each device element 222 may include one or more transistors, such as metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc., diodes, and/or other applicable elements. In some embodiments, the device elements are formed in and on the semiconductor substrate 202 in a front-end-of-line (FEOL) process.

In some embodiments, the plurality of device elements 222 are a plurality of pixel device for an image sensor. Each pixel device may include a transfer gate 218 which extends into the corresponding doped region 206. Various transistors for a pixel device may be formed in the transistor region 204 of the semiconductor substrate 202 and the ILD layer 220. For example, a pixel device may include a transfer transistor, a reset transistor, a source-follower transistor, and a select transistor. The pixel device may include other suitable transistors, such as a shutter gate transistor, a storage transfer transistor, or a combination thereof. Source/drain features for various transistors and shallow trench isolation (STI) may be formed in the transistor region 204 of the semiconductor substrate 202. Gate structures for the various transistors may be formed in the ILD layer 220.

In operation 106, an interconnect structure 224 is formed over the ILD layer 220, as shown in FIG. 4. The interconnect structure 224 includes multiple levels of conductive lines and conductive vias embedded multiple layers of dielectric materials to provide electrical paths to various the device elements 222 formed below. The dielectric material may be a low-k material, such as $SiO_x$, $SiO_xC_yH_z$, SiOCN, SiON, or $SiO_xC_y$, where x, y and z are integers or non-integers. In some embodiments, the interconnect structure 224 may include etch stop layers between levels of low-k dielectric material layers to facilitate patterning and formation of the conductive lines and conductive vias at different levels. The etch stop layers may be made of silicon carbide (SiC), silicon nitride (SixNy), silicon carbonitride (SiCN), silicon oxycarbide (SiOC), silicon oxycarbon nitride (SiOCN), tetraethoxysilane (TEOS) or another applicable material.

The conductive lines and conductive vias may be made from one or more electrically conductive materials, such as metal, metal alloy, metal nitride, or silicide. For example, the conductive lines and conductive vias are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, iridium, other suitable conductive material, or a combination thereof.

Figure 5:
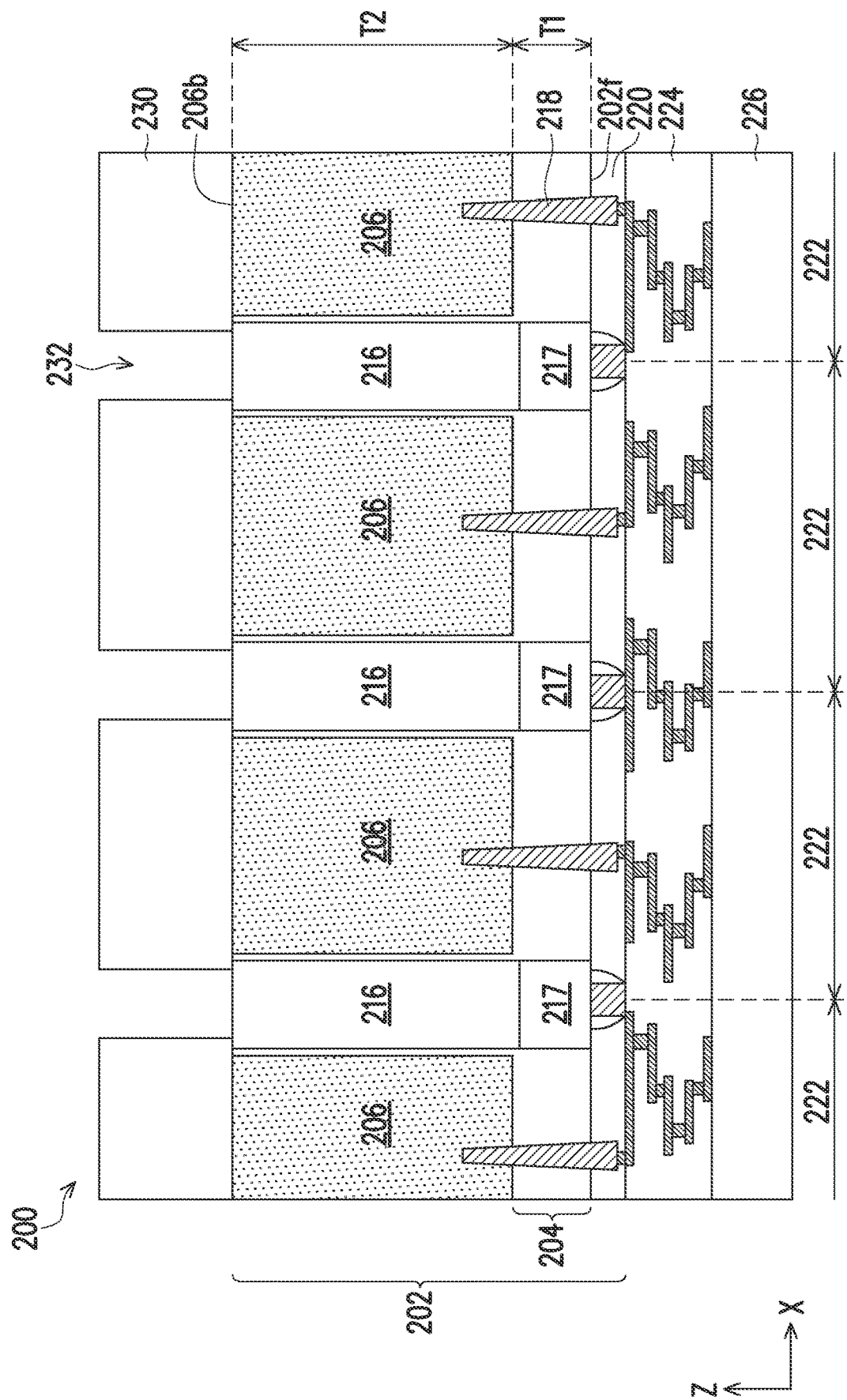
Figure 6:
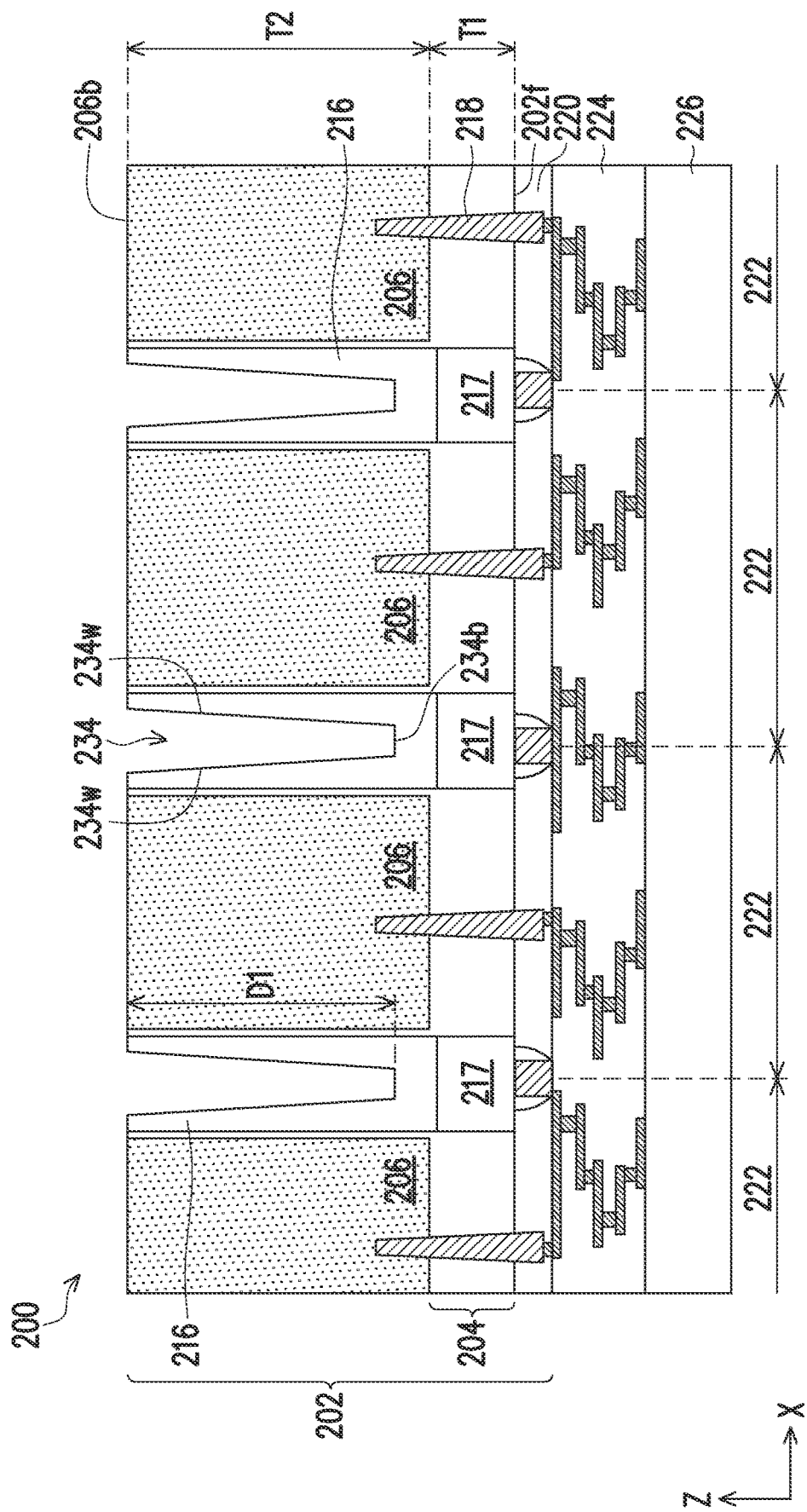

At operation 108, deep isolation trenches 234 are formed in the DPWs 216 of the semiconductor substrate 202, as shown in FIGS. 5 and 6. In FIG. 5, a carrier wafer 226 is attached to the interconnection structure 224 and the semiconductor substrate 202 is flipped over upside down for back side processing.

A backside grinding may be performed to grind the back surface 202b to thin down the semiconductor substrate 202. In some embodiments, the thickness of the semiconductor substrate 202 may be reduced to smaller than about 10 µm, or smaller than about 5 µm. In some embodiments, the semiconductor substrate 202 is grinded to expose the doped region 206, resulting a back surface 206b, as shown in FIG. 5.

A masking layer 230 may be deposited on the back surface 206b. A patterning process, such as a photolithography process, is performed form a plurality of openings 232 through the masking layer 230 and expose the back surface 206b of the semiconductor substrate 202. In some embodiments, the masking layer 230 may comprise photoresist or a nitride, such as SiN, patterned using a photolithography process.

The openings 232 are aligned with the DPWs 216. An etch process is performed to remove a portion of the DPWs 216 in the semiconductor substrate 202 and form the deep isolation trenches 234. When viewed from the top, the deep isolation trenches 234 form a grid and surround the plurality of doped regions 206 for the pixel elements 222.

In some embodiments, an anisotropic etching process is performed so that sidewalls 234w of the deep isolation trenches 234 are straight and vertical, i.e., the sidewalls 234w are substantially perpendicular to the back surface 206b. In some embodiments, the deep isolation trenches 234 may also be slightly tapered, and hence the sidewalls 234w of the deep isolation trenches 234 are slightly tilted relative to the back surface 206b. For example, an angle α between the sidewall 234w and the back surface 206b may be greater than about 88 degrees and smaller than 90 degrees. In some embodiments, the deep isolation trenches 234 are formed within the DPWs 216 so that sidewalls 234w include p-type semiconductor material.

In some embodiments, the deep isolation trenches 234 may have a depth D1 in a range between about 0.5 µm and about 10 µm, and a width W1 in a range between about 0.025 µm and about 0.3 µm. In some embodiments, an aspect ratio D1/W1 of the deep isolation trenches 234 may be in a range between about 10 and 20. In some embodiments, the deep isolation trenches may extend through the thickness T2 of the doped regions 206 to provide full coverage to the doped regions 206. In other embodiments, the deep isolation trenches 234 may substantially cover the thickness T2 of the doped regions 206.

In some embodiments, the etching process is performed through a dry etching method including, and not limited to, Inductively Coupled Plasma (ICP), Transformer Coupled Plasma (TCP), Electron Cyclotron Resonance (ECR), Reactive Ion Etch (RIE), and the like. The etching process may be performed using process gases including, fluorine-containing gases, such as $SF_6$, $CF_4$, $CHF_3$, $NF_3$, Chlorine-containing gases (such as $Cl_2$), $Br_2$, HBr, $BCl_3$, and/or the like.

At operation 110, a defect repairing layer 236 is formed on the sidewalls 234w and the bottom 234b of the deep isolation trenches 234, as shown in FIG. 6. As discussed previously, the sidewalls 234w and the bottom 234b of the deep isolation trenches 234 include semiconductor material, such as p-type semiconductor materials of the semiconductor substrate 202 or the DPWs 216.

Figure 7:
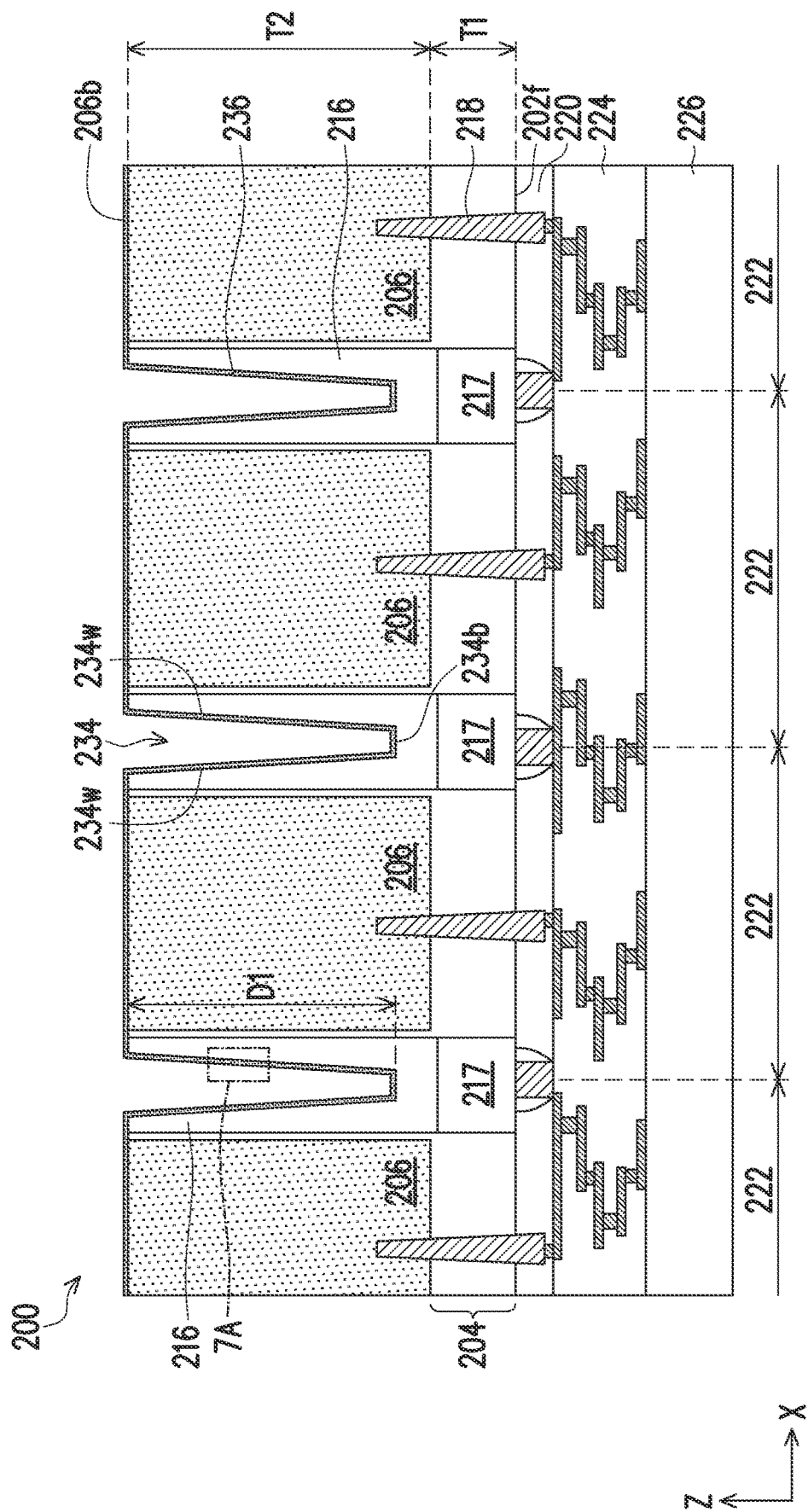
Figure 7A:
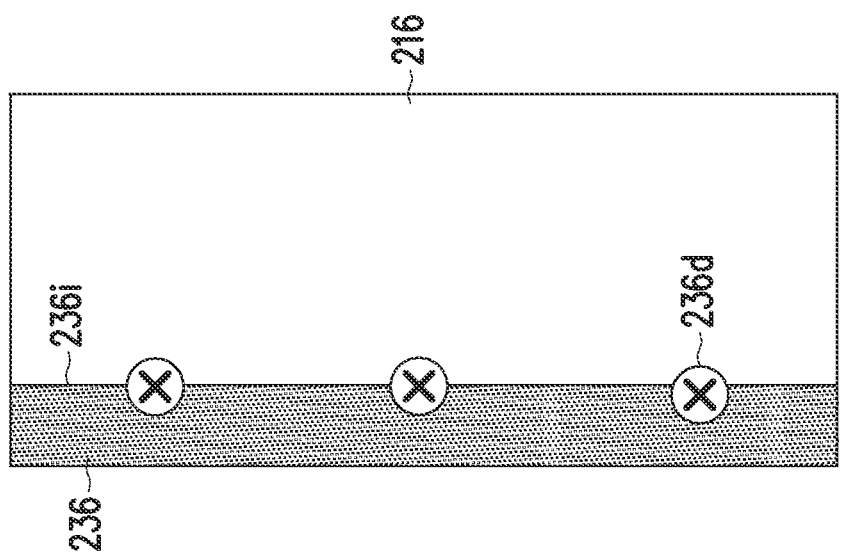
Figure 8:
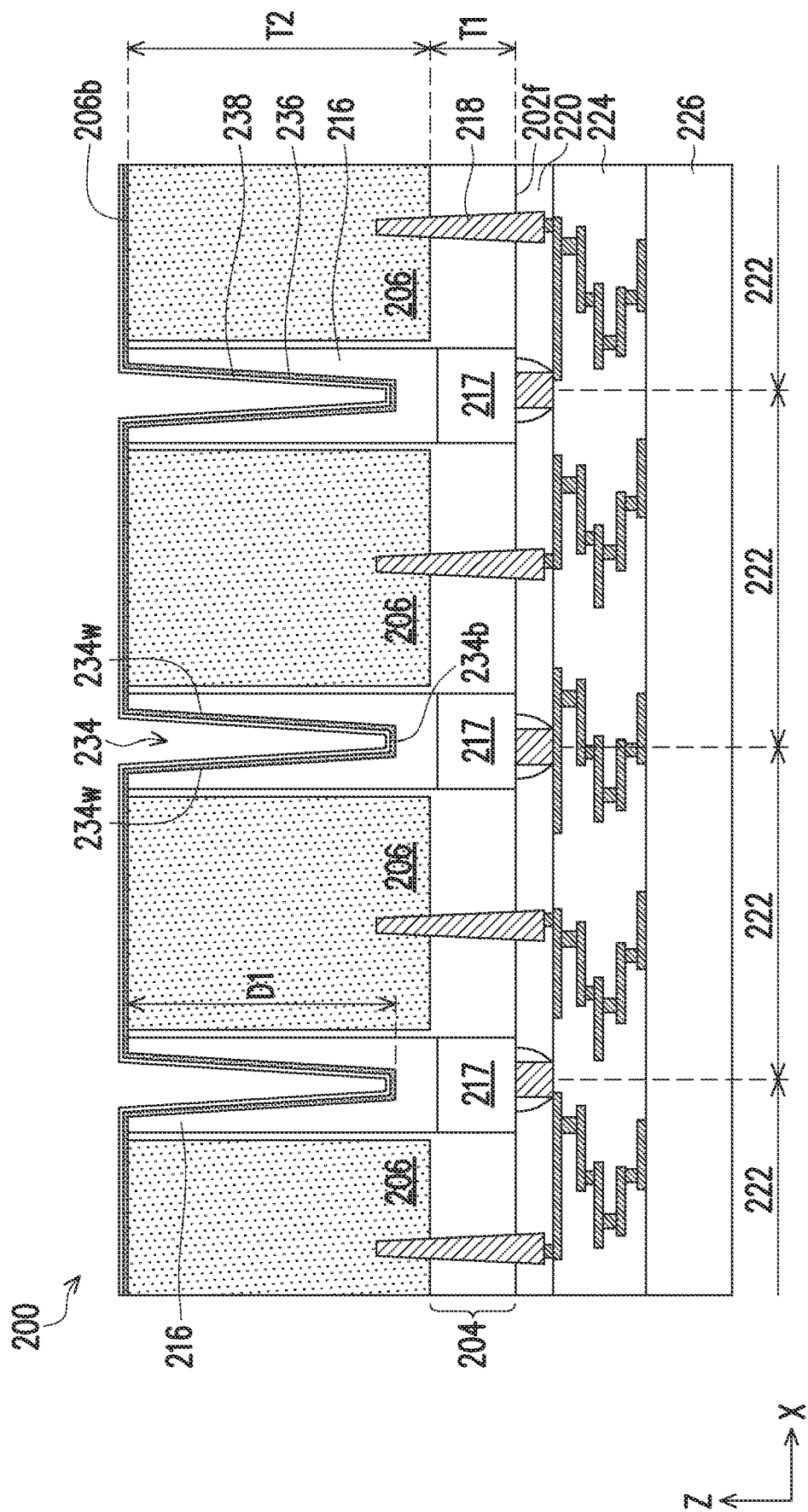

FIG. 7A is a partial enlarged view of the area marked 7A in FIG. 7. As shown in FIG. 7A, the defect repairing layer 236 has an interface 236i with the DPW 216 of the semiconductor substrate 202. Dangling bonds of the semiconductor element at the interface 236i would trap and fix charge, thus reduce hole accumulation in a hole accumulation layer. At the interface 236i, the defect repairing layer 236 is directly formed on the semiconductor materials on the sidewalls 234w and is configured to passivate dangling semiconductor bonds in the sidewalls 234w of the deep isolation trenches 234. For example, when the semiconductor substrate 202 is a silicon substrate, the defect repairing layer 236 is configured to passivate the dangling silicon bonds at the sidewall 234w. In some embodiments, the density of interface trap (Dit) at the interface 236i is in a range between 3.6E11 and about 4.2E11. A typical density of interface defect at an interface between silicon and a high-k material, such as aluminum oxide, is about 1.3E12. Therefore, the defect repairing layer 236 reduces density of interface trap (Dit) at the interface 236i in a range between about 50% to about 70%.

In some embodiments, the defect repairing layer 236 includes a nitrogen or hydrogen rich material, for example, a nitride, an oxynitride, a hydroxide. In some embodiments, the defect repairing layer 236 may be a nitride, an oxynitride, or a hydroxide of a metal or metal alloys. For example, the defect repairing layer 236 may be nitride, an oxynitride, or a hydroxide of aluminum, a transition metal, or alloys thereof. For example, the defect repairing layer 236 may be aluminum nitride (AlN), aluminum oxynitride (AlON), aluminum hydroxide (AlOH), hafnium oxynitride (HfON), Zirconium oxynitride (ZrON), titanium oxynitride (TiON), hafnium aluminum oxynitride (HfAlON), or the like.

In some embodiments, the defect repairing layer 236 may be formed by a low temperature deposition process, such as a deposition process at a temperature lower than about 410° C., such as a plasma enhanced atomic layer deposition (PEALD), plasma enhanced chemical vapor deposition (PECVD), and any suitable process. The defect repairing layer 236 may be formed by using a precursor of a metal source, and a precursor of hydrogen or nitrogen.

In some embodiments, the defect repairing layer 236 may include an aluminum nitride (AlN) layer deposited by PEALD, using an aluminum-containing precursor, such as trimethylaluminum (TMA), triethylaluminium (TEA), or other suitable chemical, and a nitrogen-containing precursor, such as ammonia ($NH_3$), tertiarybutylamine (TBAm), phenyl hydrazine, or other suitable chemical.

In some embodiments, the defect repairing layer 236 is a nitrogen containing layer. In some embodiments, the defect repairing layer 236 includes a metal oxynitride deposited by alternatively flowing a metal containing precursor, an oxygen plasma, and an ammonia plasma with $NH_3/N_2$ or a nitrogen plasma.

The defect repairing layer 236 may be conformally deposited on all exposed surfaces. In some embodiments, the defect repairing layer 236 has a thickness T3 (shown in FIG. 10A) in a range between about 1 angstrom and about 50 nm. If the thickness T3 is thinner than 1 angstrom, the defect repairing layer 236 may not able to sufficiently reduce the density of interface defect. If the thickness T3 is thicker than 50 nm, the defect repairing layer 236 may cause negative shift of flat band voltage without providing additional benefit of reducing density of interface defect.

In operation 112, a hole accumulation layer 238 is deposited on the defect repairing layer 236, as shown in FIG. 7. The hole accumulation layer 238 may include high-k material with high negativity to form hole accumulation in adjacent semiconductor, such as the semiconductor in the sidewall 234w of the deep isolation trenches 234. In some embodiments, the hole accumulation layer 238 include one or more metal oxide with an areal oxygen density greater than the areal oxygen density in silicon oxide. In some embodiments, the hole accumulation layer 238 is formed of aluminum oxide ($Al_2O_3$), titanium oxide ($TiO_2$), hafnium oxide ($HfO_2$), tantalum oxide ($Ta_2O_5$), scandium oxide ($Sc_2O_3$), zirconium oxide ($ZrO_2$), magnesium oxide (MgO), lutetium oxide ($Lu_2O_3$), yttrium oxide ($Y_2O_3$), lanthanum oxide ($La_2O_3$), hafnium aluminum oxide (HfAlO), or the like, or a composite layer including more than one of these layers.

In some embodiments, the hole accumulation layer 238 may be deposited using a conformal deposition method such as Atomic Layer Deposition (ALD), chemical vapor deposition (CVD), or the like.

In some embodiments, an over-oxidization treatment is performed after deposition of the hole accumulation layer 238 to increase interstitial oxygen (Oi) in the hole accumulation layer 238. In some embodiments, the over-oxidization treatment may be performed by exposing the hole accumulation layer 238 to plasma of an oxygen source, such as nitrogen oxide ($N_2O$), ozone ($O_3$), and the like, for a period of time. In some embodiments, the over-oxidization treatment may be performed between 60 seconds and 300 seconds. In some embodiments, the over-oxidization treatment is performed at a temperature lower than 410° C., for example between 300° C. and 400° C.

In some embodiments, after the over-oxidization treatment, the interstitial oxygen (Oi) in the hole accumulation layer 238 is greater than about 7% of bulk oxygen in the hole accumulation layer 238. Bulk oxygen refers to oxygen in a bond with metal atom in a metal oxide. In some embodiments, the ratio of interstitial oxygen over bulk oxygen may be in a range between about 7% and about 12%. Not meant to bound by theory, it has been observed that metal oxide material with a higher areal oxygen density has a larger flat band voltage, thus enable strong "electron" capture and hole accumulation in semiconductors, such as silicon. Additional interstitial oxygen in the hole accumulation layer 238 further increases the areal hydrogen density, thus, improving hole accumulation at the interface 236i with the semiconductor substrate 202. When the ratio of interstitial oxygen over bulk oxygen is less than 7%, the interstitial oxygen may not produce meaningful improvement to hole accumulation. When the ratio of interstitial oxygen over bulk oxygen is greater than 12%, the hole accumulation layer 238 may become unstable or lose structural integrity.

In some embodiments, the hole accumulation layer 238 has a thickness T4 (shown in FIG. 10A) in a range between about 50 angstroms and 500 angstroms. If the thickness of the hole accumulation layer 238 is less than about 50 angstroms, the hole accumulation layer 238 may not provide adequate ability of hole generation at the interface 236i with the semiconductor substrate 202. A thickness greater than about 500 angstroms may not provide additional benefit. In some embodiments, a ratio of the thickness of the defect repairing layer 236 over the thickness of the hole accumulation layer 238 is in a range between 0.01 and 1.0.

In some embodiments, the high-k material in the hole accumulation layer 238 may have advantageously optical reflective properties to provide optical isolation between the pixel elements 222.

Figure 9:
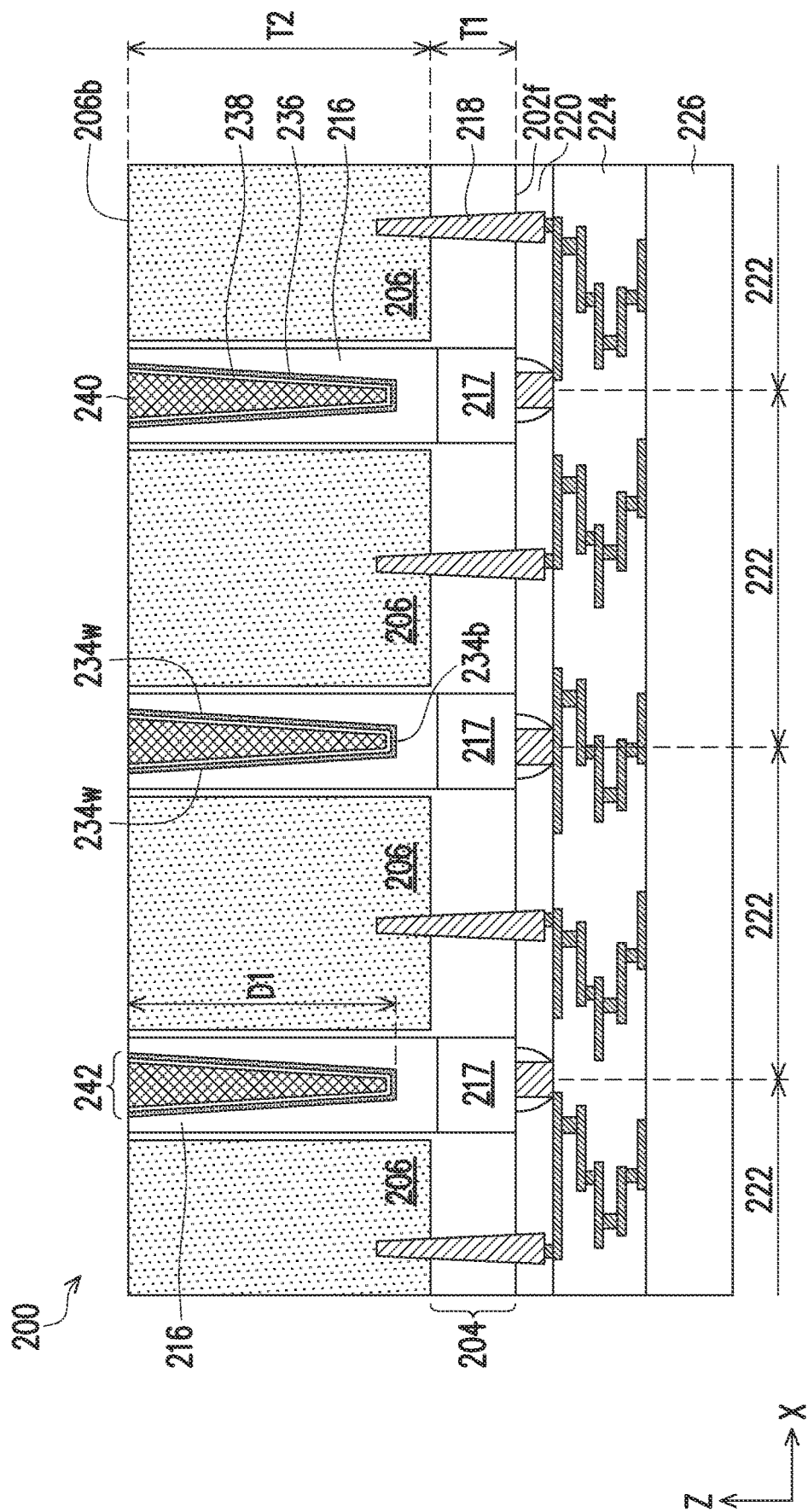

In operation 114, a filing material 240 is deposited on the hole accumulation layer 238 and fill the deep isolation trenches 234, as shown in FIG. 9. In some embodiments, the filling material 240 may be a dielectric material. For example, the filling material 240 may be an oxide, such as silicon oxide. The filling material 240 may be deposited using any suitable process, such as chemical vapor deposition (CVD), atomic layer deposition (ALD). In some embodiments, the silicon oxide is formed by CVD using a suitable precursor, such as silane ($SiH_4$) or tetraethoxysilane or $Si(OC_2H_5)_4$ (TEOS). In some embodiments, the filling material 240 may over fill the deep isolation trenches 234 after deposition.

In some embodiments, the filling material 240 may be material with high optical reflective properties, such as a material with higher than about 90 percent reflectivity to wavelength greater than about 600 nm. In some embodiments, the high reflective material may be a metallic material, such as copper, and aluminum copper (AlCu). In some embodiment, the high reflective material may be formed by performing a physical vapor deposition (PVD) to form a seed layer followed by a plating process to fill the deep isolation trenches 234 with the metallic material.

In some embodiments, air gaps may be present after deposition of the filling material 240. For example, air gaps may be present within the filling material 240 in the deep isolation trenches 234. In other embodiments, the filling material 240 may choke off the deep isolation trench 234 leaving portions of the hole accumulation layers 238 exposed to the air gaps.

In some embodiments, one or more air gaps may be formed in the filling material 240. In some embodiments, a subsequent planarization process, such as a CMP process, may be performed to expose the doped regions 206.

Figure 9A:
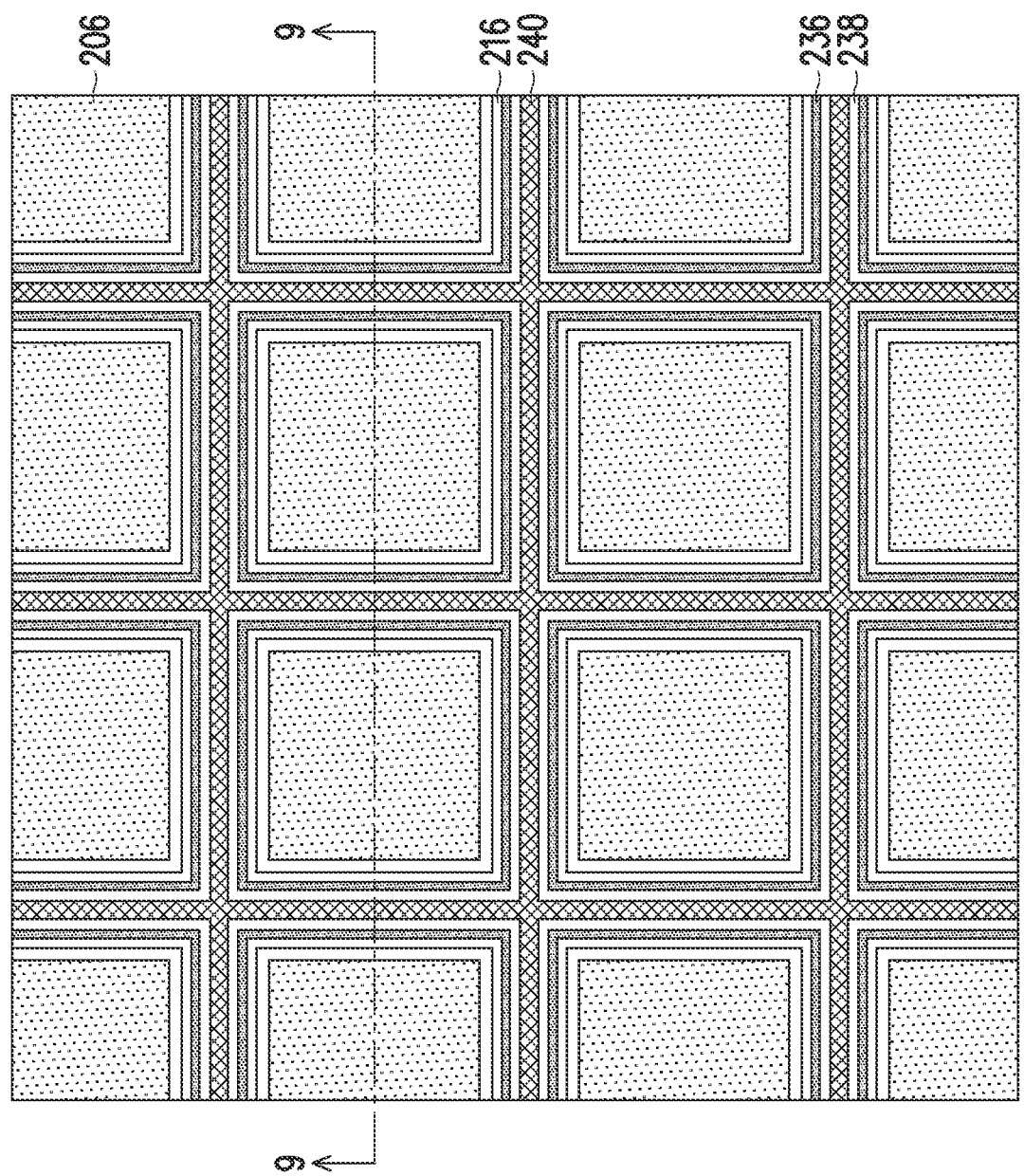

The filing material 240, the hole accumulation layer 238, and the defect repairing layer 236 in the deep isolation trenches 234 form a backside deep trench isolation (BDTI) structure 242. FIG. 9A is a schematic top view of the semiconductor device 200 after operation 114. FIG. 9A illustrates that the BDTI structure 242 forms a BDTI grid surrounding the plurality of doped regions 206. Each doped region 206 corresponds to one pixel element 222 and functions as the light sensing area in the pixel element 222. The BDTI structure 242 provides optical and electrical isolation to the plurality of doped regions 206. In some embodiments, the defect repairing layer 236 and the hole accumulation layer 238 function to provide passivation to the adjacent pixel element 222. The defect repairing layer 236 and the hole accumulation layer 238 may be referred to as a composite passivation layer.

Figure 10:
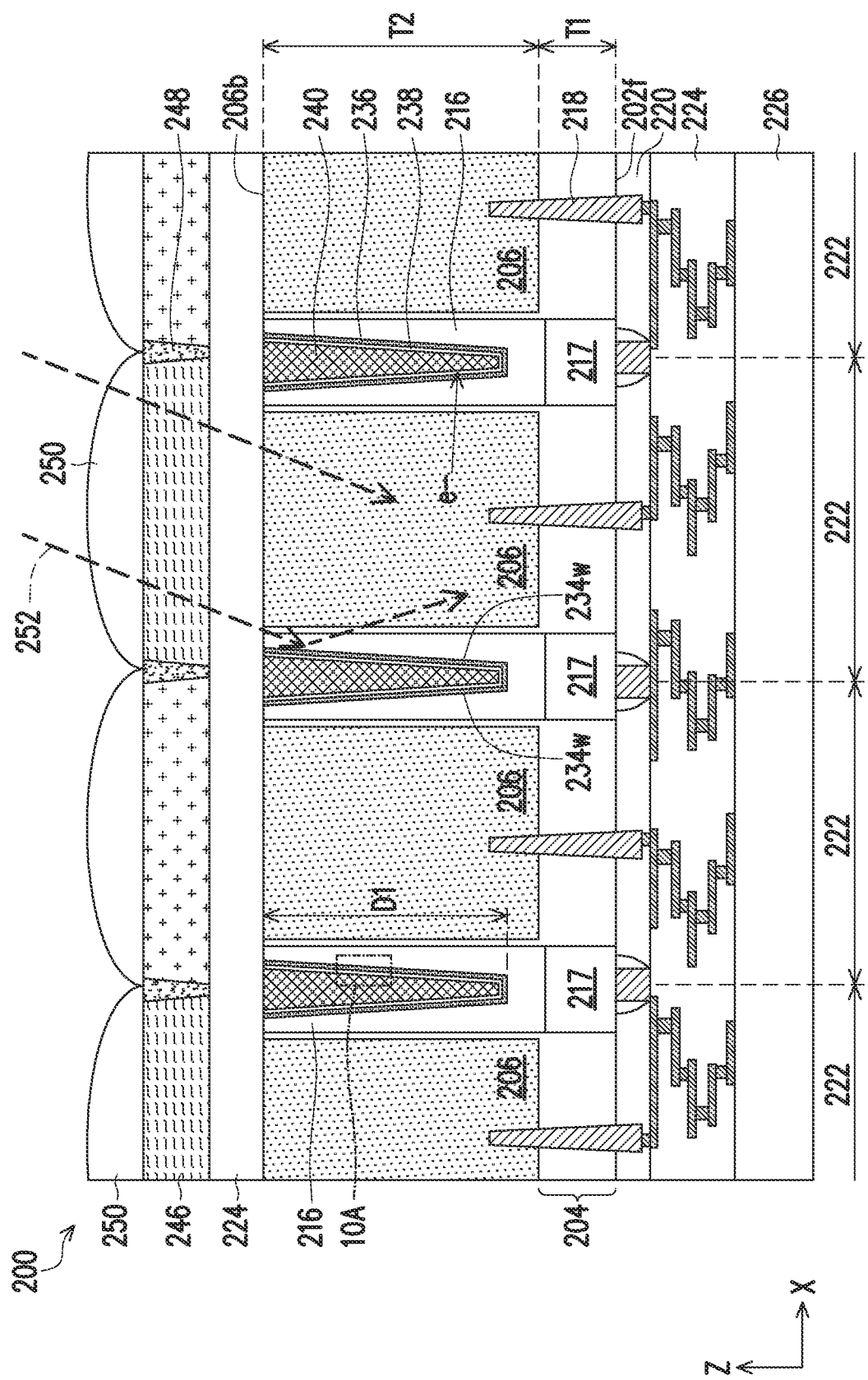

In operation 116, a plurality of color filters 246 are formed over the plurality of device elements 222, as shown in FIG. 10. In some embodiments, one or more absorption enhancement layers 244 may be deposited on the back surface 206b prior to forming the color filters 246. The one or more absorption enhancement layers 244 is configured to increase absorption of radiation by the doped regions 206 by providing for a low reflection of radiation from the semiconductor substrate 202. In some embodiments, the one or more absorption enhancement layers 244 may comprise a high-k dielectric material and a layer of silicon oxide.

The plurality of color filters 246 are formed over the one or more absorption enhancement layers 244. In some embodiments, the plurality of color filters 246 are aligned with the plurality of device elements 222. The plurality of color filters 246 may be formed by depositing a color filter layer and patterning the color filter layer. The color filters 246 are formed of material that allows transmission of radiation having a specific range of wavelength while blocking light of wavelengths outside of the specified range.

In some embodiments, an isolation structure 248 may be formed between neighboring color filters 246 to prevent radiation transmitted from one color filters 246 from projecting into the doped regions 206 under neighboring color filters 246.

In operation 118, a plurality of micro lenses 250 are formed over the plurality of color filters 246, as shown in FIG. 10. In some embodiments, the plurality of micro lenses 250 may be formed by depositing a micro lens material 250 above the plurality of color filters 246 by a suitable process, such as a spin-on method or a deposition process. In some embodiments, a micro lens template having a curved upper surface is patterned above the micro lens material. The micro lens template may comprise a photoresist material, for example, for a negative photoresist. For a negative photoresist, more light is exposed at a bottom of the curvature and less light is exposed at a top of the curvature. The micro lens template is then developed and baked to form a rounding shape. The plurality of micro lenses 250 are then formed by selectively etching the micro lens material according to the micro lens template.

As shown in FIG. 10, the semiconductor device 200 is an imaging sensing device including a plurality of device elements 222 with the doped regions 206 as light sensing regions separated by the BDTI structure 242. Electromagnetic radiation 252, such as light, projects to the doped regions 206 through the corresponding micro lens 250 and color filter 254. As shown in FIG. 10, the BDTI structure 242 functions as optical isolator preventing electromagnetic radiation 252 from entering neighboring doped regions 206.

Figure 10A:
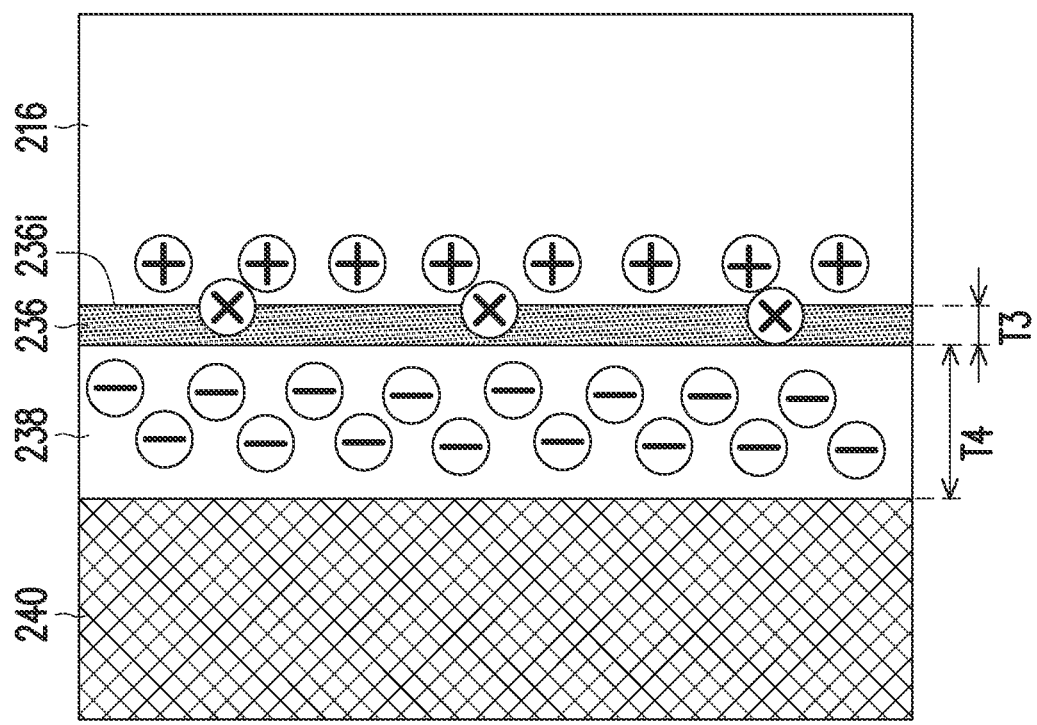

Upon receiving the electromagnetic radiation 252, the doped regions 206 emit electrons due to the photoelectric effect. The BDTI structure 242 also functions to prevent the electrons from migrating into neighboring doped regions. FIG. 10A is a schematic enlarged partial view of the semiconductor device 200 in an area marked 10A in FIG. 10. As shown in FIG. 10A, the nitrogen rich or hydrogen rich defect repairing layer 236 reduces density of interface traps (Dit) at the interface 236i, therefore, increases hole accumulation in the DPW 216 of the semiconductor substrate 202.

Figure 11:
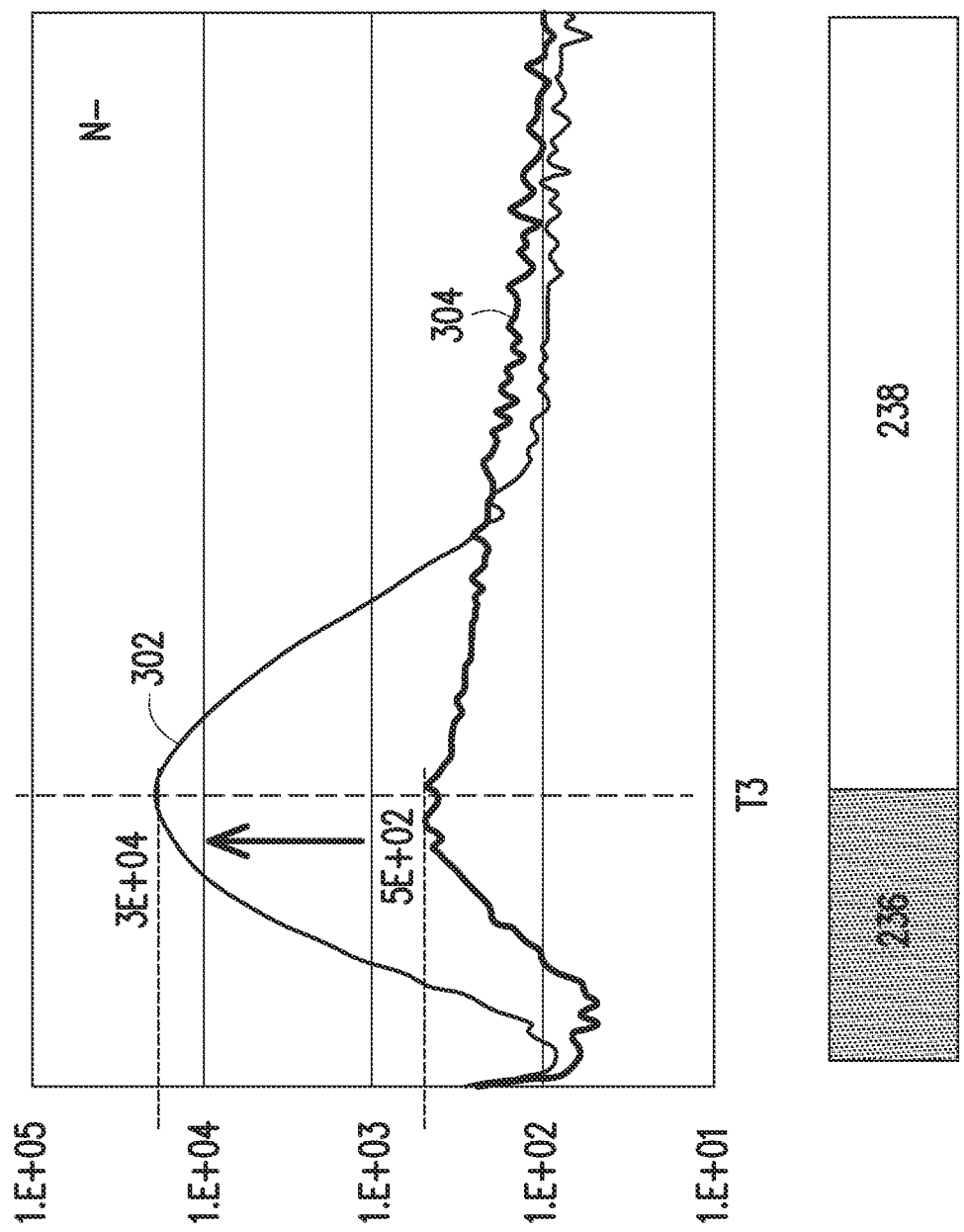
FIG. 11 is schematic graph showing nitrogen concentration in a DTI structure according to embodiments of the present disclosure.

In some embodiments, the defect repairing layer 236 is a nitrogen containing material, and the defect repairing layer 236 and the hole accumulation layer 238 may have a peak atomic concentration of nitrogen (N) in a range between about $1E04/cm^3$ and about $3E04/cm^3$. FIG. 11 is a schematic graph of atomic concentration of nitrogen in one example of the defect repairing layer 236 and the hole accumulation layer 238. Curve 302 denotes the atomic concentration of nitrogen in the defect repairing layer 236 including aluminum nitride and the hole accumulation layer 238 including aluminum oxide. As shown in the curve 302, the peak nitrogen concentration occurs near the interface between the defect repairing layer 236 and the hole accumulation layer 238. Curve 304 denotes the atomic concentration of nitrogen in an aluminum oxide layer directly formed on the semiconductor layer as hole accumulation layer. As shown in FIG. 11, the atomic concentration of nitrogen according to the present disclosure is about 2 orders higher than state-of-art hole accumulation layer.

Figure 12:
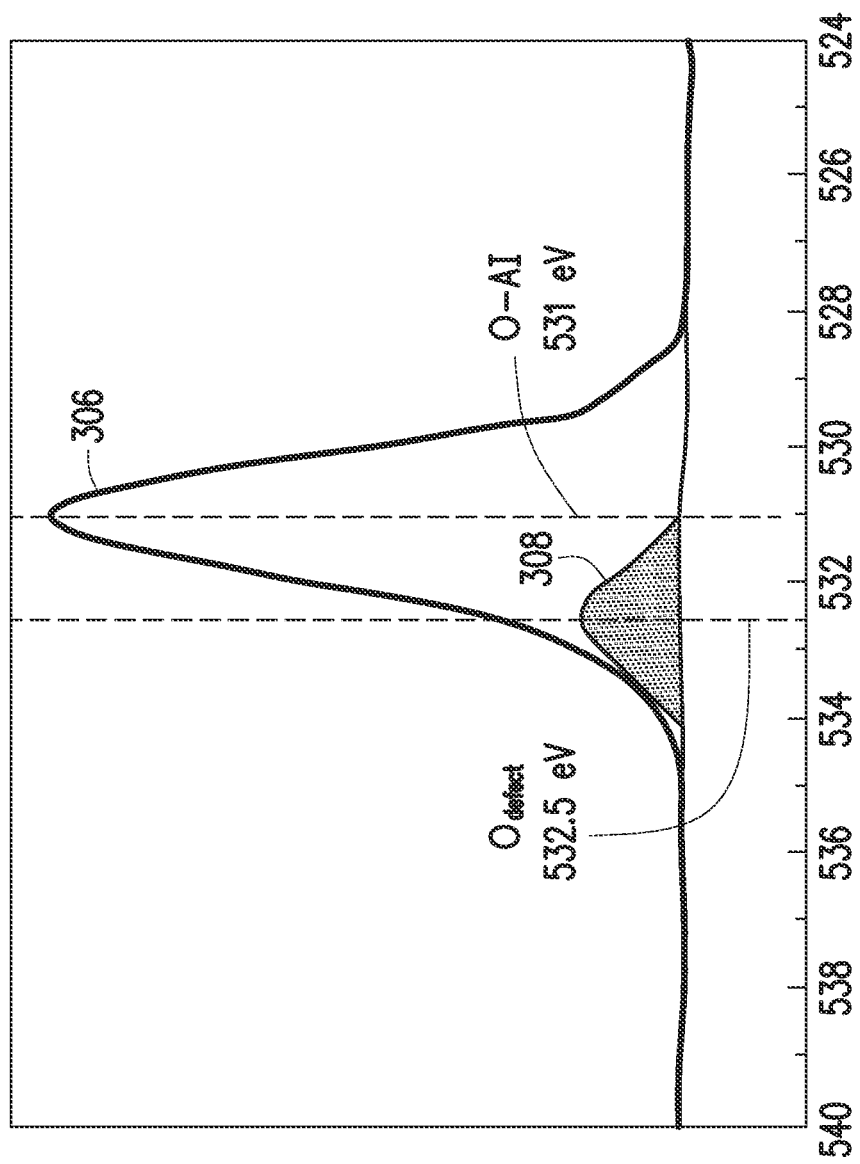
FIG. 12 is a schematic graph showing oxygen concentration in a DTI structure according to embodiments of the present disclosure.

Referring back to FIG. 10A, the hole accumulation layer 238 according to the present disclosure is formed with oxide having an areal oxygen density greater than areal oxygen density of silicon oxide. In some embodiments, a ratio of the areal oxygen density in the hole accumulation layer 238 over the areal oxygen density in silicon oxide is in a range greater than 1.0 and less than 1.4. In some embodiments, the hole accumulation layer 238 also include interstitial oxygen at a ratio between 7% and 12% of bulk oxygen. FIG. 12 is a schematic X-ray photoelectron spectroscopy (XPS) spectrum of oxygen 1s of the hole accumulation layer 238. A main peak 306 is for oxygen with a lower binding energy (such as 531 eV), which corresponds to lattice oxygen or bulk oxygen, such as oxygen in Metal-O covalence. A minor peak 308 is for oxygen with a higher binding energy (such as 533 eV), which corresponds to non-lattice oxygen, such as interstitial oxygen. With an increase in the minor peak, the flat band voltage shifts positively, resulting in stronger electron capture power in the hole accumulation layer 238. In some embodiments, the flat band voltage may increase more than 8%. For example, the flat band voltage may increase from 1.94 volt to 2.11 volt with more negatively charge.

It has been observed that a composite passivation layer including AlN and AlO according to the present disclosure has density of interface trap in a range between 6.4E+11 and 4.2E+11, which is about 34% improvement over current technology. In one example, the composite passivation layer according to the present disclosure includes an AlO layer as the hole accumulation layer 238 and an AlN layer with a thickness of 5 nm as the defect repairing layer 236. The density of interface trap on AlO-silicon interface is lowered to about 3E+11. The density of interface trap on AlO-silicon interface without the AlN layer is about 1E+12. Therefore, the composite passivation layer according to the present disclosure improves the density of interface trap by about 67%.

Various embodiments or examples described herein offer multiple advantages over the state-of-art technology. By using a nitrogen or a hydrogen rich layer between the semiconductor substrate and the high-k hole accumulation layer to passivate dangling bonds in a semiconductor substrate, the DTI structure according to the present disclosure may be used to effectively provide electrical isolation without high temperature anneal.

Some embodiments of the present disclosure provide a method. The method comprises forming a plurality of pixel elements in and on a front side of a semiconductor substrate; forming deep isolation trenches from a backside of the semiconductor substrate, wherein the deep isolation trenches surround a plurality of doped regions corresponding to the plurality of pixel elements; depositing a defect repairing layer on sidewalls of the deep isolation trenches, wherein the defect repairing layer containing nitrogen or hydrogen; depositing a hole accumulation layer on the defect repairing layer, wherein the hole accumulation layer comprises a metal oxide; over-oxidizing the hole accumulation layer to add interstitial oxygen to the hole accumulation layer; filling the deep isolation trenches with a filling material; forming a plurality of color filters; and forming a plurality of micro lenses.

Some embodiments of the present disclosure provide a method. The method comprises doping a semiconductor substrate to form a doped region with a first dopant; doping a gap region around the doped region with a second dopant; forming a pixel element over the doped region and the gap region from a front surface of the semiconductor substrate; forming an interconnect structure over the pixel element; etching a deep isolation trench in the gap region from a back surface of the semiconductor substrate; depositing a nitrogen containing layer on sidewalls of the deep isolation trench, wherein the nitrogen containing layer has a peak atomic concentration of nitrogen in a range between about 1E04/$cm^3$ and about 3E04/$cm^3$; depositing a high-k dielectric layer on the nitrogen containing layer; depositing a filling material on the high-k dielectric layer to fill the deep isolation trench; forming a color filter on the back surface of the semiconductor substrate; and forming a micro lens on the color filter.

Some embodiments of the present disclosure provide a structure. The structure comprises a plurality of pixel elements formed in and on a semiconductor substrate; a deep trench isolation (DTI) structure formed in the semiconductor substrate, wherein the DTI structure separates individual pixel elements, and the DTI structure comprises: a defect repairing layer in contact with the semiconductor substrate, wherein the defect repairing layer contains nitrogen or hydrogen; a hole accumulation layer in contact with the defect repairing layer, wherein the hole accumulation layer comprises a metal oxide, and a ratio of interstitial oxygen over bulk oxygen is greater than 7%; and a filling material in contact with the hole accumulation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method comprising:
forming a plurality of pixel elements in and on a front side of a semiconductor substrate;
forming deep isolation trenches from a backside of the semiconductor substrate, wherein the deep isolation trenches surround a plurality of doped regions corresponding to the plurality of pixel elements;
depositing a defect repairing layer on sidewalls of the deep isolation trenches, wherein the defect repairing layer comprises a metal hydroxide;
depositing a hole accumulation layer on the defect repairing layer, wherein the hole accumulation layer comprises a metal oxide;
over-oxidizing the hole accumulation layer to add interstitial oxygen to the hole accumulation layer;
filling the deep isolation trenches with a filling material;
forming a plurality of color filters; and
forming a plurality of micro lenses.

2. The method of claim 1, wherein the defect repairing layer comprises aluminum hydroxide (AlOH).

3. The method of claim 2, wherein the defect repairing layer has a thickness in a range between about 1 angstrom and about 50 nm.

4. The method of claim 1, wherein depositing the hole accumulation layer comprises depositing a high-k dielectric layer.

5. The method of claim 4, wherein over-oxidizing the hole accumulation layer comprises treating the hole accumulation layer with a plasma of oxygen source at a temperature below about 410° C.

6. The method of claim 5, wherein a ratio of interstitial oxygen over bulk oxygen in the hole accumulation layer is greater than 7%.

7. The method of claim 5, wherein the hole accumulation layer has a thickness in a range between about 50 angstroms and 500 angstroms.

8. The method of claim 1, wherein a density of defect traps at an interface between the defect repairing layer and the semiconductor substrate in a range between 3.6E11 and about 4.2E11.

9. A method, comprising:
doping a semiconductor substrate to form a doped region with a first dopant;
doping a gap region around the doped region with a second dopant;
forming a pixel element over the doped region and the gap region from a front surface of the semiconductor substrate;
forming an interconnect structure over the pixel element;
etching a deep isolation trench in the gap region from a back surface of the semiconductor substrate;
passivating dangling semiconductor bonds on sidewalls of the deep isolation trench by depositing a defect repairing layer on the sidewalls of the deep isolation trench;
depositing a high-k dielectric layer on the defect repairing layer;
treating the high-k dielectric layer with an oxygen source to increase interstitial oxygen in the high-k dielectric layer;
depositing a filling material on the high-k dielectric layer to fill the deep isolation trench;
performing a planarization process to remove the filing material, the high-k dielectric layer and the defect repairing layer from the back surface of the substrate;
forming a color filter on the back surface of the semiconductor substrate; and
forming a micro lens on the color filter.

10. The method of claim 9, wherein a ratio of interstitial oxygen over bulk oxygen in the high-k dielectric layer is in a range between 7% and 12%.

11. The method of claim 10, wherein a density of defect traps on an interface between the defect repairing layer and the gap region of the semiconductor substrate in a range between 3.6E11 and about 4.2E11.

12. A structure, comprising:
a plurality of pixel elements formed in and on a semiconductor substrate;
a deep trench isolation (DTI) structure formed in the semiconductor substrate, wherein the DTI structure separates individual pixel elements, and the DTI structure comprises:
a defect repairing layer in contact with the semiconductor substrate, wherein the defect repairing layer contains hydrogen, and the defect repairing layer contains a metal hydroxide;
a hole accumulation layer in contact with the defect repairing layer, wherein the hole accumulation layer comprises a high-k dielectric material having an areal oxygen density greater than an areal oxygen density of silicon oxide, and
a filling material in contact with the hole accumulation layer.

13. The structure of claim 12, wherein the hole accumulation layer comprises a metal oxide, and a ratio of interstitial oxygen over bulk oxygen is greater than 7%.

14. The structure of claim 13, wherein the ratio of interstitial oxygen over bulk oxygen in the hole accumulation layer is less than 12%.

15. The structure of claim 12, wherein the defect repairing layer comprises one of aluminum hydroxide (AlOH).

16. The structure of claim 15, wherein the defect repairing layer has a thickness in a range between about 1 angstrom and about 50 nm.

17. The structure of claim 12, wherein the deep trench isolation structure is formed in a back surface of the semiconductor substrate, and an absorption enhancement layer is formed on the back surface of the semiconductor substrate and the deep trench isolation structure.

18. The structure of claim 12, wherein the defect repairing layer has a first thickness, the hole accumulation layer has a second thickness, a ratio of the first thickness over the second thickness is in a range between about 0.01 and about 1.0.

19. The method of claim 9, wherein depositing the defect repairing layer comprises performing a low temperature deposition at a temperature lower than about 400° C.

20. The method of claim 9, wherein treating the high-k dielectric layer comprises treating the high-k dielectric layer with a plasma of oxygen source at a temperature range between about 300° C. and about 400° C.

* * * * *